United States Patent
Do et al.

(10) Patent No.: US 7,410,824 B2
(45) Date of Patent: Aug. 12, 2008

(54) METHOD FOR SOLDER BUMPING, AND SOLDER-BUMPING STRUCTURES PRODUCED THEREBY

(75) Inventors: Byung Tai Do, Singapore (SG); Romeo Emmanuel P. Alvarez, Singapore (SG); Yaojian Lin, Singapore (SG)

(73) Assignee: Stats Chippac Ltd., Singapore (SG)

( * ) Notice: Subject to any disclaimer, the term of this patent is extended or adjusted under 35 U.S.C. 154(b) by 275 days.

(21) Appl. No.: 11/009,436

(22) Filed: Dec. 9, 2004

(65) Prior Publication Data

US 2006/0125110 A1 Jun. 15, 2006

(51) Int. Cl.
*H01L 21/44* (2006.01)
*H01L 21/48* (2006.01)
*H01L 21/50* (2006.01)
*H01L 21/4763* (2006.01)

(52) U.S. Cl. .................. 438/106; 438/637; 438/640
(58) Field of Classification Search ......... 438/106–127, 438/624–653
See application file for complete search history.

(56) References Cited

U.S. PATENT DOCUMENTS

| | | | |
|---|---|---|---|
| 5,024,372 A | 6/1991 | Altman et al. | |
| 6,316,289 B1 * | 11/2001 | Chung | 438/118 |
| 6,592,943 B2 * | 7/2003 | Chan et al. | 427/282 |
| 6,756,184 B2 | 6/2004 | Peng et al. | |
| 6,759,319 B2 | 7/2004 | Viswanadam et al. | |
| 2002/0173134 A1 * | 11/2002 | Viswanadam et al. | 438/613 |

* cited by examiner

*Primary Examiner*—Cuong Q Nguyen
(74) *Attorney, Agent, or Firm*—Mikio Ishimaru

(57) ABSTRACT

A method for solder bumping provides a substrate and forms a film on the substrate. The film has openings therethrough. A stencil is aligned on the film. The stencil has openings therethrough over the openings through the film. Solder paste is printed onto the substrate and into the openings through the stencil and the openings through the film. The solder paste is reflowed to form solder balls therefrom. The stencil and the film are then removed.

10 Claims, 6 Drawing Sheets

METHOD FOR SOLDER BUMPING, AND SOLDER-BUMPING STRUCTURES PRODUCED THEREBY

TECHNICAL FIELD

This invention relates to packaged semiconductor devices and methods for the manufacture thereof. More particularly, the invention pertains to solder bumping methods for producing large solder bumps for such devices, and to semiconductor devices that are provided with such large solder bumps.

BACKGROUND ART

Solid-state electronic devices (e.g., semiconductor "chips" or "dies") are typically manufactured from a semiconductor material such as silicon, germanium arsenide, or gallium arsenide. Circuitry is formed on one surface, and includes input and output ("I/O") pads to facilitate electrical connection to other circuit components.

Semiconductor chips are usually packaged for protection from mechanical damage, external contamination, and moisture. Typically, packages encapsulate the semiconductor chips within a polymeric or ceramic material.

As the configurations of electronic products become more and more light and compact, semiconductor chip packages are increasingly required to be ever smaller and more compact as well. Packages are now nearly as small as the semiconductor chips that they enclose, giving rise to numerous chip scale package ("CSP") configurations.

Presently, the many CSP package configurations and formats can be classified generally into four types, based on their design concepts and package structures:
 (1) Leadframe based CSPs, in which the electrical connection from the chip package is accomplished by electrical wiring leads;
 (2) CSPs with Rigid Substrate, in which a ceramic substrate or a rigid printed circuit board of polymer material is applied in between the bare chip and the package housing structure;
 (3) CSPs with Flexible Substrate, in which a soft substrate (e.g., polyimide) is used as a carrier, and an elastomer is inserted between the chip and the substrate to decrease stress; and
 (4) Wafer-level CSPs, in which the carrier substrate is usually a wafer, the sizes of the packages are almost the same as the sizes of the chips, and electrical connections are by solder bump techniques similar to that of flip-chips.

Electronic packaging techniques, for example systems-in-package ("SiP") that use such wafer level CSP formats, thus face ever-increasing demands. The ability to use large-sized solder bumps at the wafer level has in fact become a critical focus in modern semiconductor packaging. Different techniques, such as direct placement of large solder balls, are known and available. But due to high equipment costs and high solder sphere costs, available techniques result in excessive total package costs.

Thus, a need still remains for less expensive solutions to create large solder bumps in wafer-level CSPs. Further, there is a need to accomplish these solutions using existing processes and equipment to minimize equipment costs, fabrication steps, process cycle times, and overall manufacturing costs. It is also important to be able to use existing materials in order to avoid the high costs of new, specialized, exotic materials. In view of the increasing needs for smaller, less expensive, yet more robust semiconductor package configurations, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for solder bumping. A substrate is provided and a film is formed on the substrate, the film having openings therethrough. A stencil is aligned on the film, the stencil having openings therethrough over the openings through the film. Solder paste is printed onto the substrate and into the openings through the stencil and the openings through the film. The solder paste is reflowed to form solder balls therefrom. The stencil and the film are then removed.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
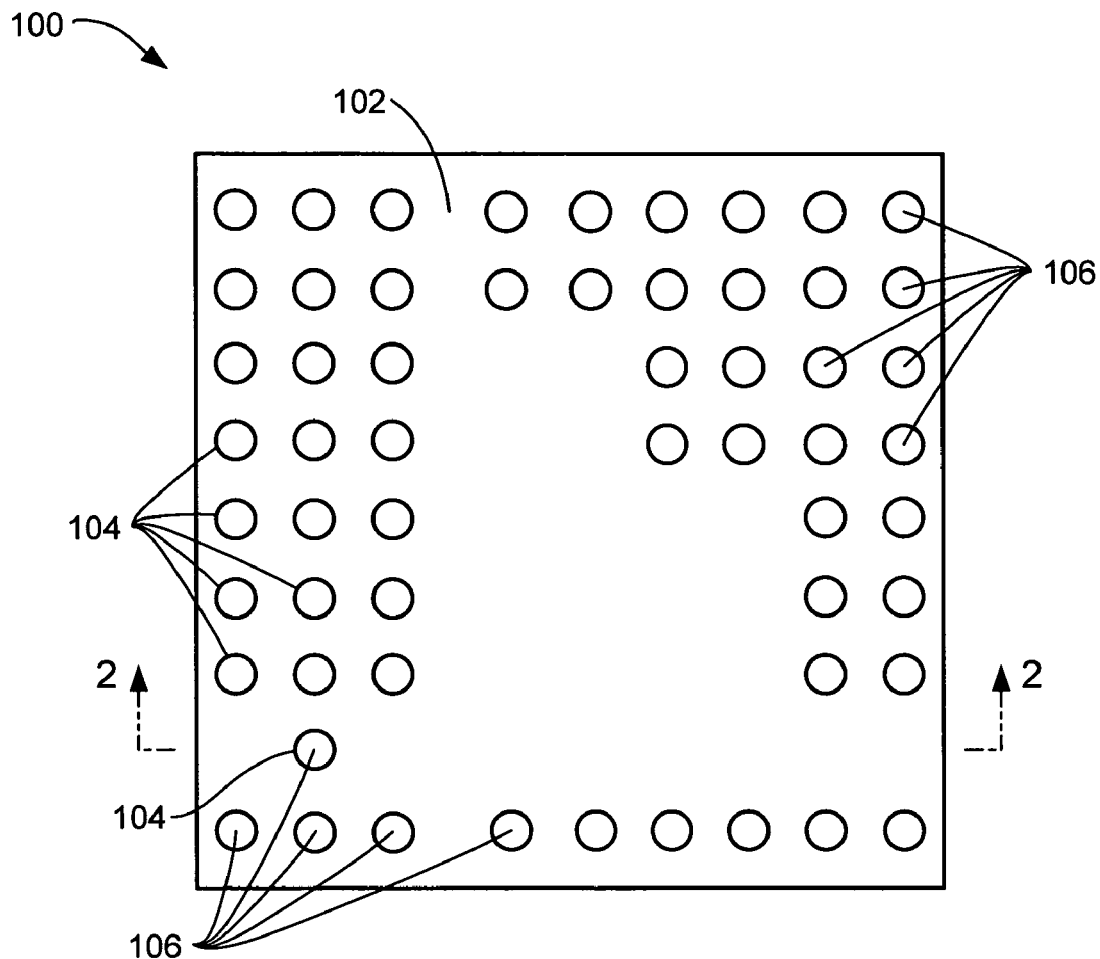
FIG. 1 is an inverted bottom plan view of a semiconductor chip.

In the following description, numerous specific details are given to provide a thorough understanding of the invention. However, it will be apparent that the invention may be practiced without these specific details. In order to avoid obscuring the present invention, some well-known configurations and process steps are not disclosed in detail.

Similarly, the drawings showing embodiments of the invention are semi-diagrammatic and not to scale and, particularly, some of the dimensions are for the clarity of presentation and are shown exaggerated in the FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the chip or wafer, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Flip chip technology has become very popular and is replacing older wire bonding technology that uses face up chips and individual wires to connect to each electrical pad on a chip. Instead, a flip chip microelectronic assembly provides direct electrical connections for electronic components to the substrate on which they are mounted. The electronic components are mounted face down (i.e., "flipped") onto the substrates and connected electrically and physically by conductive solder bumps on the flip chips. Flip chips are also known as "direct chip attach" because the chip is directly attached electrically and physically in this manner to the substrate, board, or carrier by the solder bumps.

Flip chip packaging has significant advantages in size, performance, flexibility, reliability, and cost over other packaging methods, resulting in an ever widening availability of flip chip materials, equipment, and services. The flip chip components used in flip chip microelectronic assemblies are predominantly semiconductor devices. However, components such as passive filters, detector arrays, micro-electrical mechanical systems, and so forth, also appear in flip chip form.

The advantages provided by flip chip technologies can be significant. In some cases, for example, the elimination of old technology packages and bond wires may reduce the required substrate or board area by as much as 25 percent or more, while requiring far less height. Similar reductions in the weight of flip chip packages can be obtained relative to older technology package devices.

Flip chips are also advantageous because of their high-speed electrical performance when compared to other assembly methods. Eliminating bond wires reduces delays from inductance and capacitance in the connections, and substantially shortens current paths, resulting in higher speed off-chip interconnection.

Flip chips also provide great input/output connection flexibility. Wire bond connections are generally limited to the perimeter of the chip or die, thus tending to drive chip sizes up as the number of connections has increased over the years. Flip chips can use the whole area of the chip for connections, however, thereby accommodating many more connections on a smaller chip. Further, flip chips can be stacked, in 3-D geometries, over other flip chips or other components.

Flip chips also provided rugged mechanical interconnections. Flip chips, particularly when underfilled with an adhesive such as an epoxy, can withstand the most rugged durability testing. In addition to providing such rugged mechanical interconnection, flip chips can be the lowest cost interconnection for high-volume automated production.

Flip chips are made by a process that includes placing solder bumps on a silicon wafer. The solder bumps of the flip chip assembly serve several functions. The bumps provide an electrically conductive path from the chip or die to the substrate on which the chip is mounted. The bumps also provide a thermally conductive path to carry heat from the chip to the substrate. The bumps further provide part (and sometimes all) of the mechanical mounting of the chip to the substrate. The chips also act as a spacer that prevents unwanted electrical contact between the chip and the substrate connectors. Finally, the bumps act to relieve mechanical strain between the chip and the substrate.

The overall solder bump flip chip process typically includes many steps. Four main steps are: 1) preparing the wafer for solder bumping; 2) forming or placing the solder bumps on the wafer; 3) attaching the solder bumped chip to a board, substrate or carrier; and 4) completing the assembly with an adhesive underfill.

The first step in a typical solder bumping process involves preparing the semiconductor chip bumping sites on electrical bond pads of the individual integrated circuits defined in the semiconductor chip. The preparation may include cleaning, removing insulating oxides, and preparing a pad metallurgy that will protect the integrated circuits while making good mechanical and electrical contact with the solder bump. Accordingly, protective metallurgy layers may be provided over the bond pad.

Sometimes referred to as under bump metallurgy ("UBM"), such protective metallurgy layers commonly consist of successive layers of metal. As an example, one known UBM layer configuration consists of an "adhesion" layer, a "diffusion barrier" layer, and a "solder wettable" layer. The "adhesion" layer adheres well to both the bond pad metal and the surrounding passivation layer, providing a strong, low-stress mechanical and electrical connection. The "diffusion barrier" layer prevents the diffusion of solder into the underlying material. The "solder wettable" layer provides a wettable surface for the molten solder during the solder bumping process, for good bonding of the solder to the underlying metal.

In fabrication of a flip-chip structure, some of the widely used methods for depositing and/or forming solder bumps, typically in the form of solder balls, include evaporation, electroplating, electroless plating, and solder paste screen printing.

In the evaporation method, solder bumps can be formed by evaporation of lead ("Pb") and tin ("Sn") through a mask to produce the desired solder bumps. When a metal mask is used, UBM metals and solder materials can be evaporated through openings in the mask and be deposited as an array of pads onto the chip surface.

In preparation for the evaporation method, a wafer is first passivated with an insulating passivation layer of, for example, silicon dioxide ("$SiO_2$"). Via holes are then etched through the wafer passivation layer to provide communication paths for the chips on the wafer to outside circuits. After a mask is aligned on the wafer, direct current sputtering cleans the via openings in the passivation layer and removes undesirable oxides, thereby assuring low contact resistance and good adhesion to the $SiO_2$.

The evaporation method then continues by evaporating a chromium layer through a mask to form an array of round metal pads, each pad covering an individual via, to provide adhesion to the passivation layer and form a solder reaction barrier to the respective bond pads underneath. A second layer of chromium/copper is then co-evaporated to provide resistance to multiple reflows. This is followed by a final UBM layer of pure copper to form a solderable metallurgy. A thin layer of gold may optionally be evaporated to provide an oxidation protection layer. These metal-layered UBM pads define the solder-wettable UBM regions on the chips.

After the completion of the UBM, solder evaporation takes place through a metal mask that has hole diameters slightly greater than the UBM mask-hole diameters. This provides the necessary solder volumes for subsequently forming the solder balls by a solder reflow process. The solder reflow process is performed at a temperature of about 350° C. to melt and homogenize the evaporated metal pad and impart a truncated spherical shape to the resulting solder bumps.

The evaporation method is a well established practice but is slow and limits the fabrication throughput rate.

In the electroplating method, UBM layers are first deposited, such as described above. This is followed by the deposition of a photoresist layer, the patterning of the photoresist layer to form openings therein, and the electro-deposition of a solder material into the photoresist openings. After the electro-deposition process is completed the photoresist layers are removed, and the UBM layers can be etched by using the plated solder bumps as a mask. The solder bumps are then reflowed in a furnace reflow process.

The electroplating method is simpler and less expensive than the evaporation method because only a single masking operation is required. However, the method has several limitations, including limitations on the sizes of the solder bumps that can be formed.

The electroless plating method is similar to the electroplating method, except that the plating is done by electroless processes (i.e., non-electrical plating by controlled autocatalytic (self-continuing) reduction).

In the solder paste screen printing method, a wafer surface that is covered by a passivation layer with exposed bond pads is provided, as described above. UBM layers are then deposited on top of the bond pads and adjacent passivation layer. After the coating of a photoresist layer and the patterning of the layer, the UBM layers are etched. The photoresist layer is then stripped off. A stencil is then aligned on the passivation layer on the wafer, with openings over the UBM. Solder paste is then squeegeed through the stencil to fill the openings on top of the bond pads and the UBM. After the stencil is removed, the solder paste is reflowed in a furnace to form solder balls on the UBM.

The solder paste screen printing bump formation method is capable of solder-bumping a variety of substrates, and can cover the area of an entire wafer.

One drawback of the solder paste screen printing method is that, with the recent and continuing trends in device miniaturization, the consequential reduction in bump-to-bump spacing (or pitch) is causing prior art solder paste screening methods to become impractical. For instance, one of the problems in applying solder paste screening techniques to modern high-density semiconductor integrated circuit ("IC") devices is directly related to this reduced pitch between the solder bumps. Since there is a large reduction in volume when the solder paste is reflowed to form the solder bumps, the screen holes must be significantly larger in diameter than the final bumps. But as the pitches become smaller and smaller, the sizes of the screen holes must inevitably also become smaller and smaller, resulting in smaller solder paste volumes and smaller and shorter-height solder bumps. This is the very opposite of what is needed—namely, to form solder bumps that are reflown into solder balls with large (or even larger) heights.

As taught herein, the present invention solves these problems. Thus, referring now to FIG. 1, therein is shown an inverted bottom plan view of a semiconductor substrate, such as a chip 100, that has been inverted (flipped), so that its bottom side is now on top. For descriptive purposes, the chip 100 is thus illustrated as a flip chip, and is shown in an intermediate stage of fabrication.

A passivation layer 102 on the chip 100 has bond pad openings 104 therethrough at various locations thereon. Within and exposed by the bond pad openings 104 are UBM layers 106 to which solder bumps are to be attached, as described further herein. In one embodiment, the bond pad openings 104 have a diameter of about 175 µm.

Figure 2:
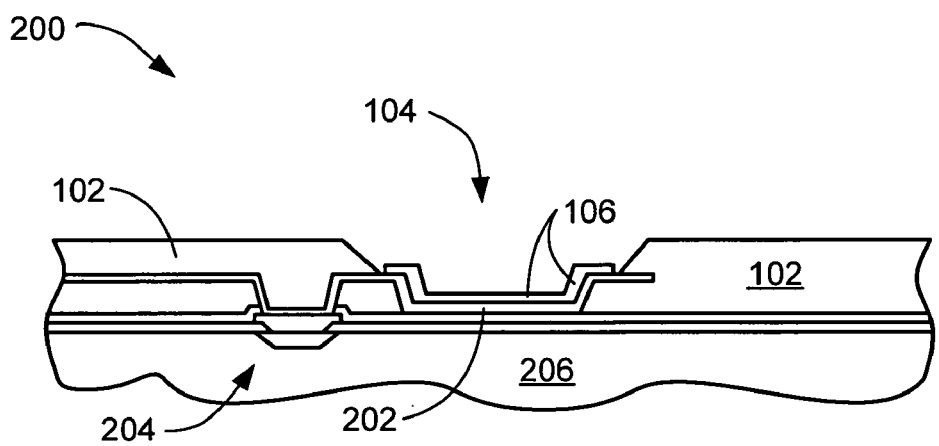
FIG. 2 is a fragmentary cross-sectional view of a portion of the semiconductor chip shown in FIG. 1, taken on line 2-2 in FIG. 1.

Referring now to FIG. 2, therein is shown a fragmentary cross-sectional view of a portion 200 of the chip 100, taken on line 2-2 in FIG. 1. The UBM layers 106 are formed on and in contact with a bond pad 202 that connects to various circuit components 204 formed on a substrate 206, the circuit components 204 being covered by the passivation layer 102.

Figure 3:
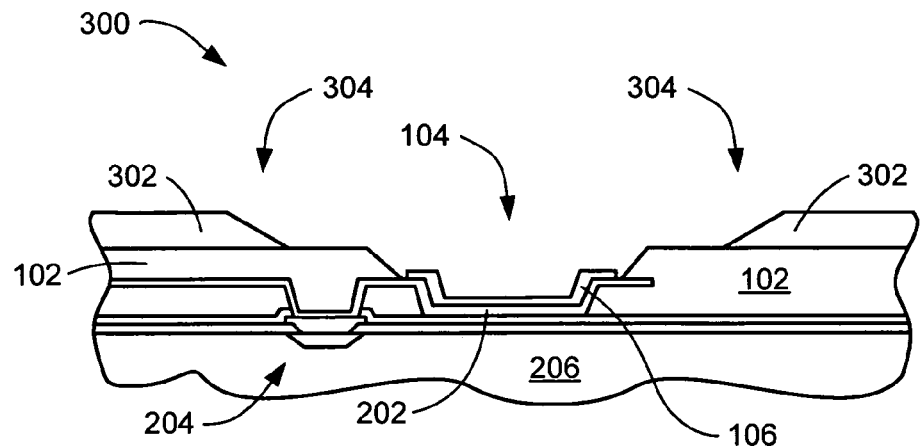
FIG. 3 is a fragmentary cross-sectional view, taken on line 3-3 in FIG. 4, of a portion of the structure of FIG. 2 following the formation and patterning on the semiconductor chip of FIG. 1 of a film having openings therethrough.
Figure 4:
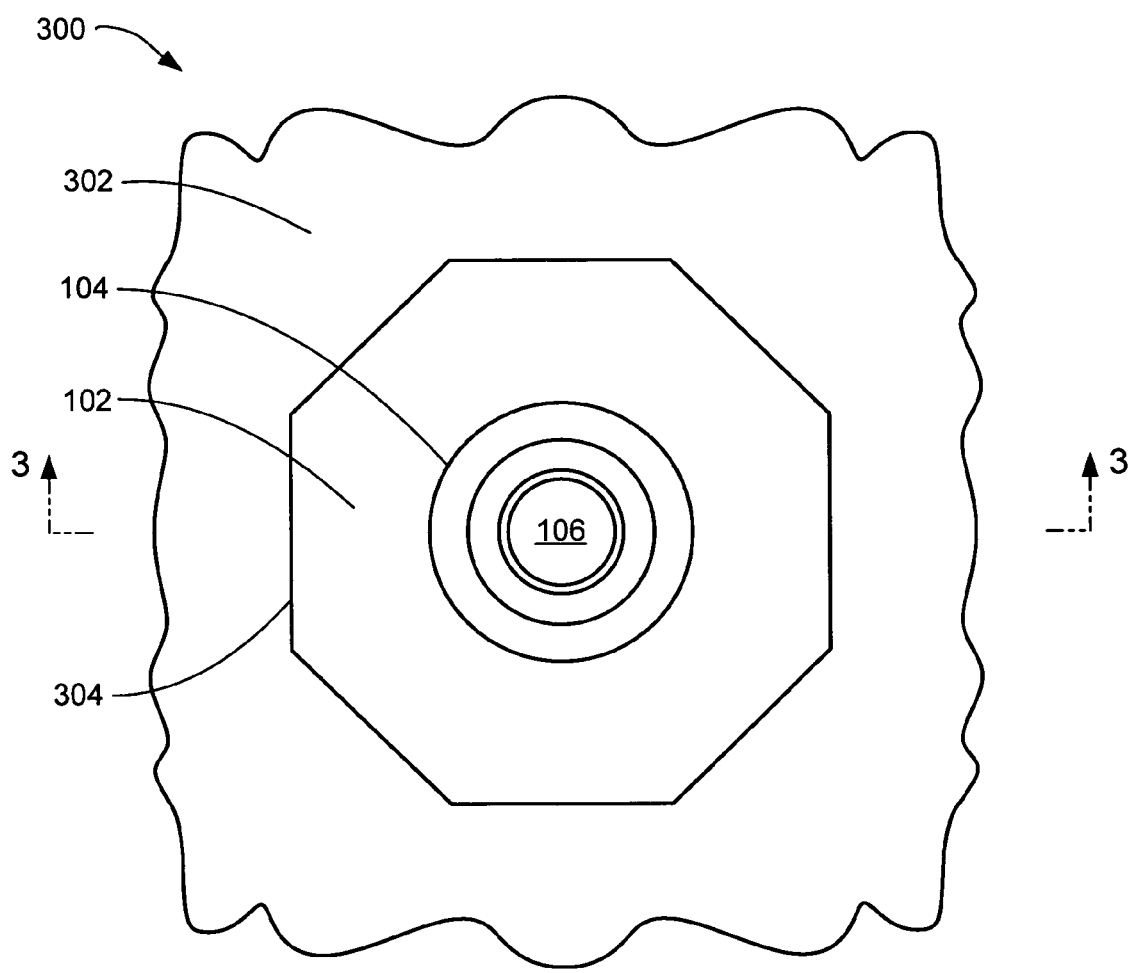
FIG. 4 is a fragmentary top plan view of the structure of FIG. 3.

Referring now to FIG. 3, therein is shown a fragmentary cross-sectional view, taken on line 3-3 in FIG. 4, of a portion 300 of the structure of FIG. 2 following the formation and patterning on the chip 100 (FIG. 1) of a film 302 having film openings 304 therethrough. The film openings 304 are centered over the bond pad openings 104 to provide access to the UBM layers 106 therebeneath. In one embodiment, the film 302 is a laminated photoresist layer formed, via photolithography, as a conventional 75 µm thick dry film, and the film openings 304 have an equivalent diameter of about 350 µm.

Referring now to FIG. 4, therein is shown a fragmentary top plan view of the structure of FIG. 3.

Figure 5:
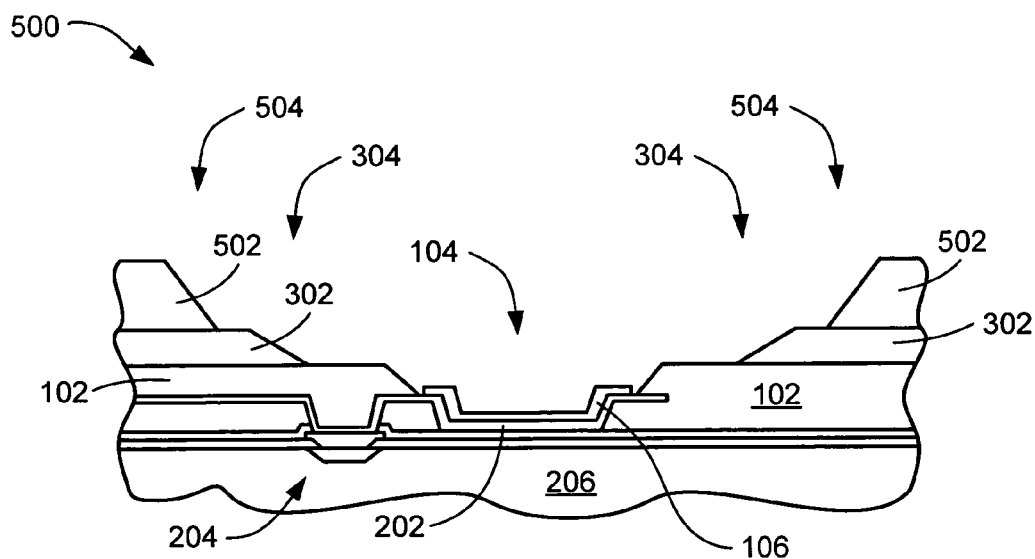
FIG. 5 is a fragmentary cross-sectional view, taken on line 5-5 in FIG. 6, of the structure of FIG. 3 following the aligning thereon of a metal stencil having stencil openings therethrough.
Figure 6:
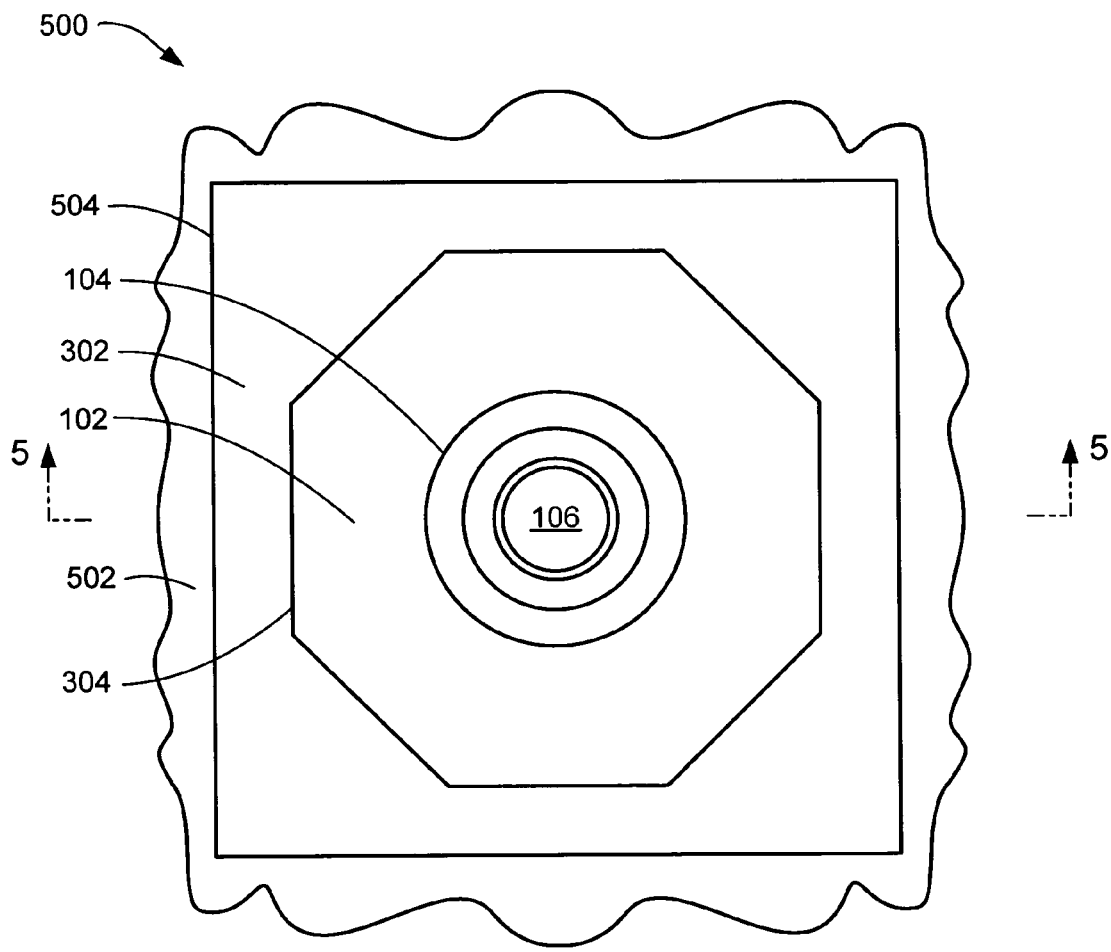
FIG. 6 is a fragmentary top plan view of the structure of FIG. 5.

Referring now to FIG. 5, therein is shown a fragmentary cross-sectional view, taken on line 5-5 in FIG. 6, of a portion 500 of the structure of FIG. 3 following the aligning thereon of a metal stencil 502 having stencil openings 504 therethrough. The stencil openings 504 are centered over the bond pad openings 104 to provide access to the UBM layers 106 therebeneath. In one embodiment, the metal stencil 502 is formed as a 150 µm thick stencil using conventional electro-forming methods, and then aligned in this manner onto the film 302. The stencil openings 504 in this one embodiment have an equivalent diameter of about 400 µm.

Referring now to FIG. 6, therein is shown a fragmentary top plan view of the structure of FIG. 5.

Figure 7:
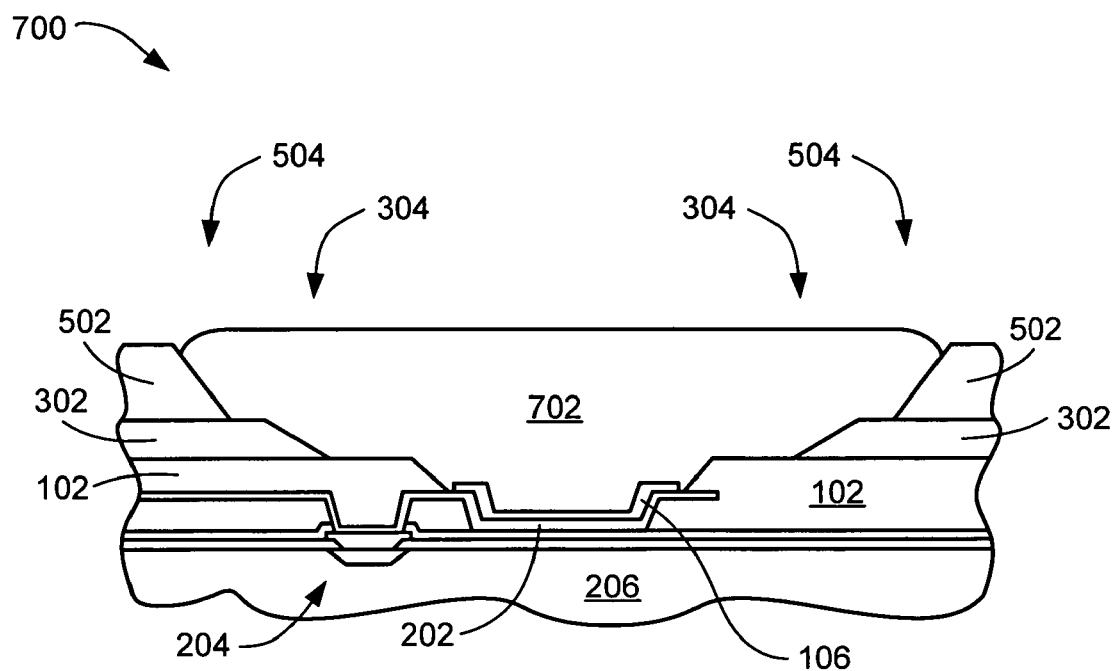
FIG. 7 is a fragmentary cross-sectional view of the structure of FIG. 5 following screen printing of solder paste.

Referring now to FIG. 7, therein is shown a fragmentary cross-sectional view of a portion 700 of the structure of FIG. 5 following screen printing of solder paste 702 onto the UBM layers 106 through and into the stencil openings 504 and the film openings 304 above the UBM layers 106. By virtue of the combination of the relatively thin resist film 302 and the metal stencil 502, it has been discovered that much larger, discrete volumes of the solder paste 702 can be printed above each of the UBM layers 106 in the stencil openings 504 and the film openings 304 despite the narrow interspacings (pitch) of the stencil openings 504. Each of these larger, discrete solder paste volumes is therefore contained compatibly within the narrow pitch of contemporary miniaturized flip-chip dimensions, providing in one embodiment for spacings between adjacent stencil openings 504 of less than 100 µm.

Figure 8:
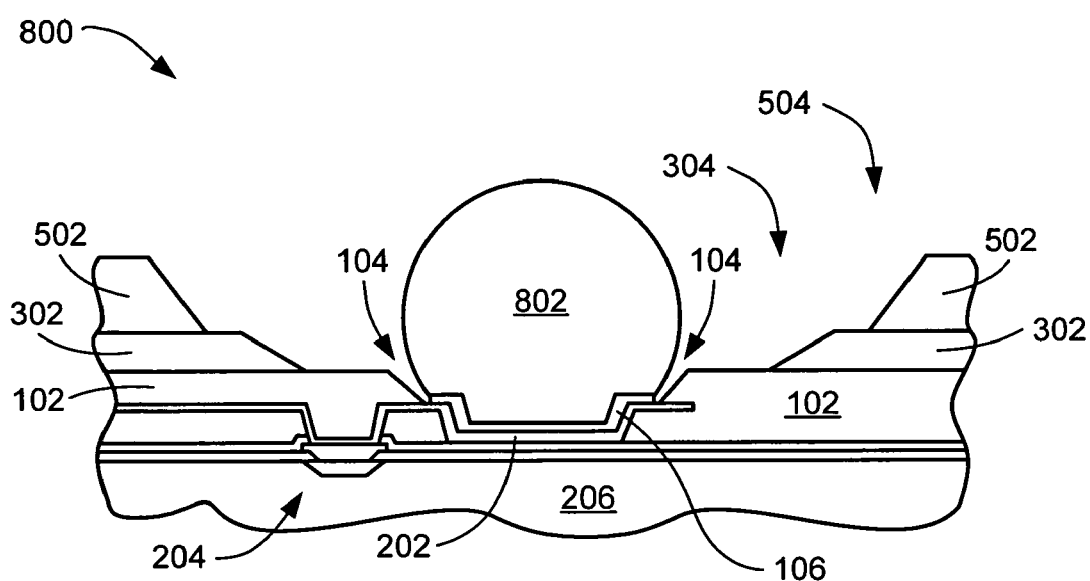
FIG. 8 is a fragmentary cross-sectional view of the solder-bumping structure of FIG. 7 following reflowing of the solder paste to form solder balls therefrom.

Referring now to FIG. 8, therein is shown a fragmentary cross-sectional view of a portion 800 of the solder-bumping structure of FIG. 7 following reflowing of the solder paste 702 (FIG. 7) to form solder balls 802 therefrom upon and in electrical contact with the UBM layers 106 therebeneath. In one embodiment, the solder balls 802 have a height above the passivation layer 102 of greater than 250 µm, which is more than twice the 100 µm height of conventional solder bumps.

Due to this significant difference in height, such large solder bumps (relative to conventional solder bumps) are also referred to as "big bumps".

Figure 9:
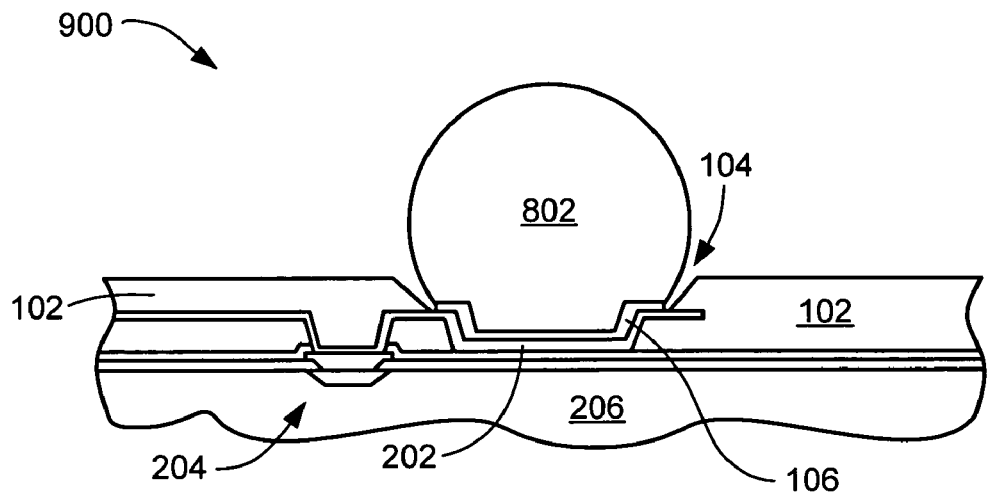
FIG. 9 is a fragmentary cross-sectional view, taken on line 9-9 in FIG. 10, of the structure of FIG. 7 following stripping of the metal stencil and the resist film in accordance with an embodiment of the present invention.
Figure 10:
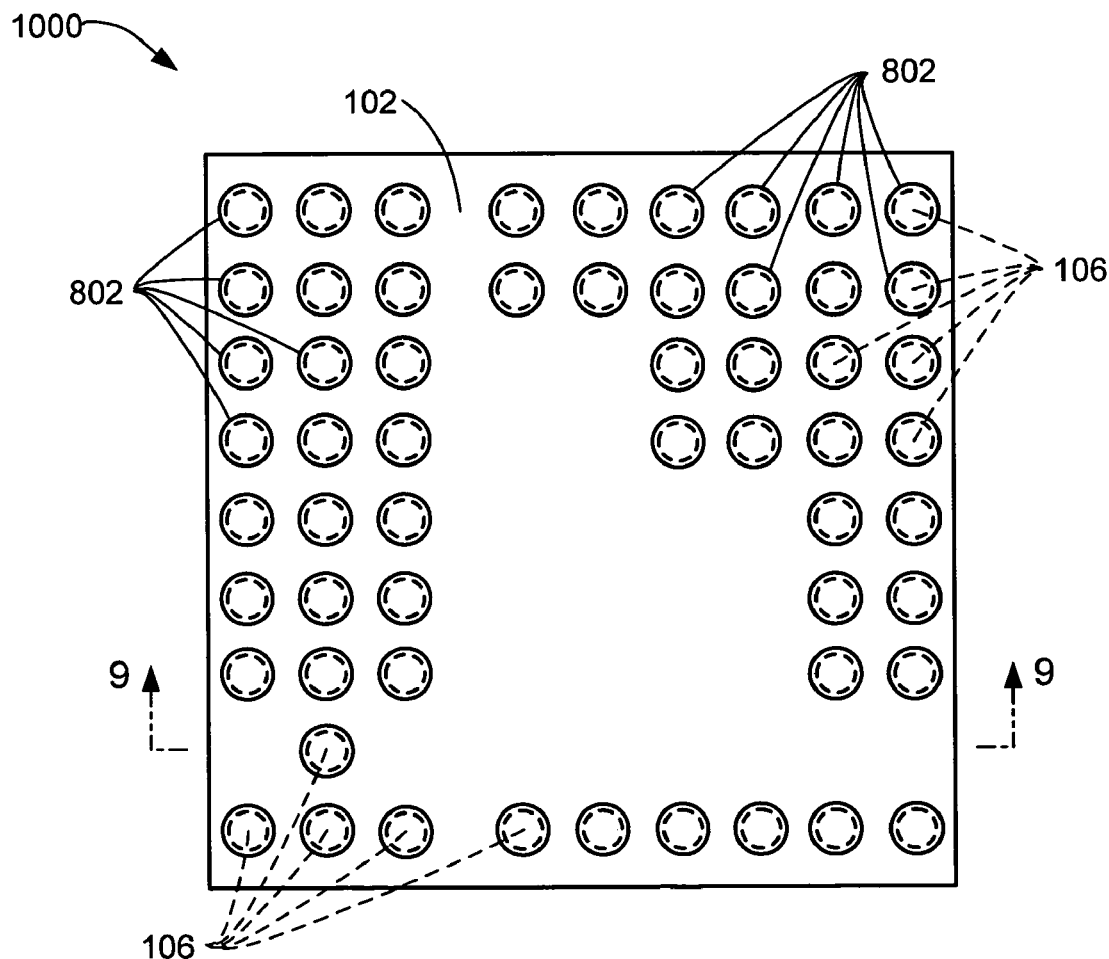
FIG. 10 is an inverted bottom plan view of the completed semiconductor chip.

Referring now to FIG. 9, therein is shown a fragmentary cross-sectional view, taken on line 9-9 in FIG. 10, of a portion 900 of the structure of FIG. 7 following stripping or removing of the metal stencil 502 and the film 302 from the substrate, followed by reflowing the solder a second time and then cleaning the device, in accordance with an embodiment of the present invention.

Referring now to FIG. 10, therein is shown an inverted bottom plan view of the completed flip chip 1000, of which the portion 900 of FIG. 9 is a fragment.

Figure 11:
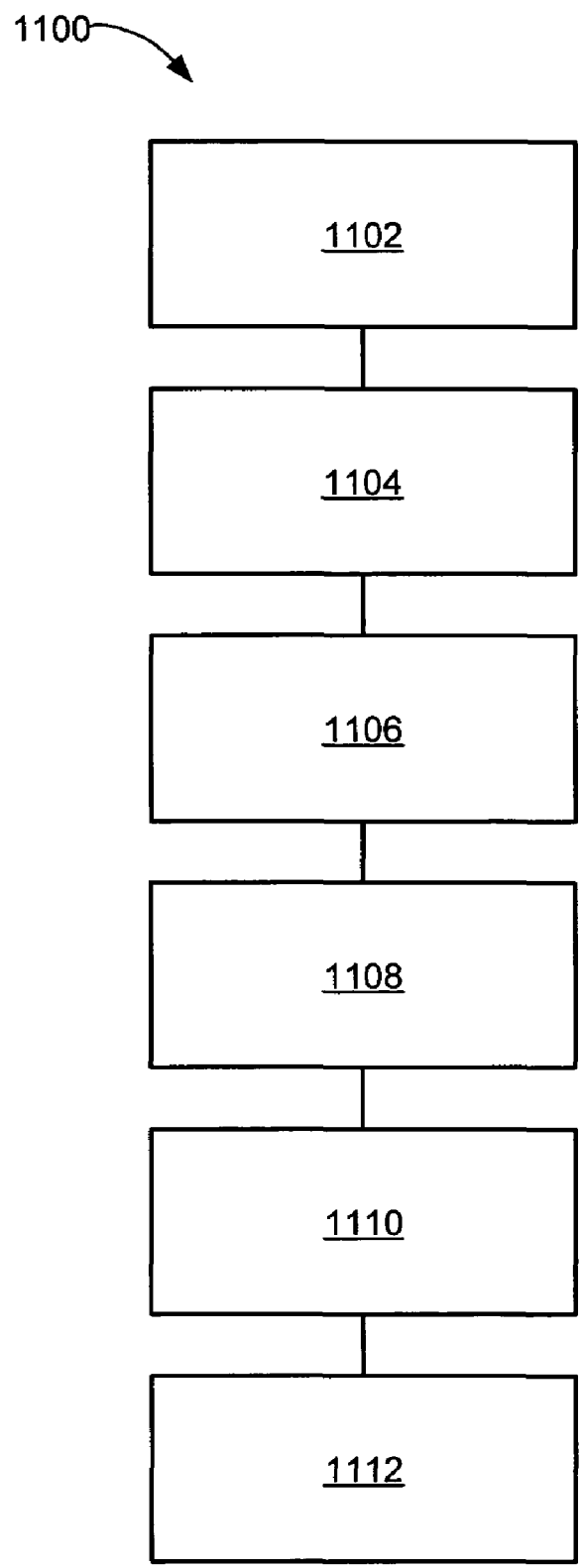
FIG. 11 is a flow chart of a method for solder bumping in accordance with an embodiment of the present invention.

Referring now to FIG. 11, therein is shown a flow chart of a method 1100 for solder bumping in accordance with an embodiment of the present invention. The method 1100 includes providing a substrate in a block 1102; forming a film on the substrate, the film having openings therethrough, in a block 1104; aligning a stencil on the film, the stencil having openings therethrough over the openings through the film, in a block 1106; printing solder paste onto the substrate and into the openings through the stencil and the openings through the film, in a block 1108; reflowing the solder paste to form solder balls therefrom, in a block 1110; and removing the stencil and the film, in a block 1112.

Based upon the above disclosure and description, it will now be clear to one of ordinary skill in the art that the invention is not limited just to use with flip chip configurations. Thus, while the invention has generally been exemplified in relation to flip chips, it will be understood that other chip and circuit board configurations that require solder bumps can likewise readily be bumped, as taught herein, for economically and efficiently forming and providing big bumps thereon as needed.

It has thus been discovered that the present invention has numerous advantages.

A principle advantage is that the present invention efficiently and economically creates larger solder bumps in finer pitch configurations and designs. The big bumps are afforded by the structures and processes disclosed and described herein that create bigger solder paste volumes than afforded by prior processes and configurations at corresponding chip configuration dimensions.

Another advantage is that such big bumps can be readily and economically formed using a unique and heretofore unknown combination of available processes and materials, and without the need to resort to expensive processes and/or exotic materials for applying previously-formed or pre-fabricated solder balls supplied from an external source.

Yet another advantage of the present invention is that it accommodates significantly smaller bump-to-bump pitch with no loss in solder bump height. In fact, the present invention provides for increased solder bump heights and volumes in smaller pitch implementations and environments.

Another advantage of the present invention is that it uses solder paste, which is substantially cheaper than solder balls.

Still another advantage of the present invention is that, due to the higher tolerance for solder fatigue, it typically does not require underfill to reinforce the bumps against solder fatigue, unlike standard-height (e.g., 100 μm bump height) solder balls.

Another advantage is that the big bumps (e.g., 250-300 μm bumps, nominal), directly enable wafer level chip size package ("WLCSP") applications, wherein the finished product can be directly mounted on the printed circuit board ("PCB") without typically requiring underfill against solder fatigue.

The present invention thus provides less expensive and more economical solutions for creating big bumps in wafer level form, including greater savings in equipment, material, and production costs.

A particular advantage of the present invention is that, in one embodiment, it combines three uncomplicated and robust processes (dry film lamination, metal stencil, and solder paste screen printing) based upon conventional elements, without needing new or additional steps, to attain the required big bump heights. The dry film lamination may be done using known photolithography from the first stages of existing dry film wafer bumping processes, but of only 75 μm film thickness, for example. The metal stencil of typically 150 μm thickness is fabricated using standard methods (e.g., electroforming). The wafer is then solder paste screen printed with the laminated dry film and thick metal stencil on top, using standard printing machines. The downstream processes after printing may then be standard flow processes. All materials may be conventional, known materials.

Accordingly, a significant advantage of the present invention is that it affords substantially faster cycle times, uncomplicated fabrication processes, and much lower manufacturing costs.

Yet another important advantage of the present invention is that it valuably supports and services the historical trend of reducing costs, simplifying systems, and increasing performance.

These and other valuable aspects of the present invention consequently further the state of the technology to at least the next level.

Thus, it has been discovered that the big bump solder bumping method and configurations of the present invention furnish important and heretofore unknown and unavailable solutions, capabilities, and functional advantages for forming and creating big bumps on IC chips, such as fine pitch flip chips. The resulting processes and configurations are straightforward, economical, uncomplicated, highly versatile and effective, can be implemented by adapting known technologies, and are thus fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for solder bumping, comprising:
providing a substrate;
forming a film on the substrate, the film having openings therethrough;
aligning a stencil on the film, the stencil having openings therethrough over the openings through the film;
printing solder paste onto the substrate and into the openings through the stencil and the openings through the film;
reflowing the solder paste to form solder balls therefrom; and
removing the stencil and the film.

2. The method of claim 1 wherein forming a film on the substrate further comprises forming a photoresist layer.

3. The method of claim 1 further comprising reflowing the solder and then cleaning the substrate.

4. The method of claim 1 wherein the film has a thickness of about 75 μm, and the stencil has a thickness of about 150 μm.

5. The method of claim 1 wherein the openings through the film have an equivalent diameter of about 350 μm, and the openings through the stencil have an equivalent diameter of about 400 μm.

6. A method for solder bumping, comprising:

providing a flip chip having under bump metallurgy layers exposed thereon;

forming a laminated dry film on the flip chip having openings therethrough over respective under bump metallurgy layers, to provide access to the under bump metallurgy layers therebeneath;

electroforming a metal stencil and aligning the metal stencil on the laminated dry film, the metal stencil having openings therethrough substantially centered over the openings through the laminated dry film to provide access to the under bump metallurgy layers therebeneath;

screen printing solder paste onto the flip chip and the under bump metallurgy layers and filling the openings through the metal stencil and the openings through the laminated dry film;

reflowing the solder paste to form solder balls therefrom upon and in electrical contact with the under bump metallurgy layers; and removing the metal stencil and the laminated dry film.

7. The method of claim 6 wherein forming a laminated dry film on the flip chip further comprises forming a photoresist layer.

8. The method of claim 6 further comprising reflowing the solder and then cleaning the flip chip.

9. The method of claim 6 wherein the laminated dry film has a thickness of about 75 μm, and the metal stencil has a thickness of about 150 μm.

10. The method of claim 6 wherein the openings through the laminated dry film have an equivalent diameter of about 350 μm, and the openings through the metal stencil have an equivalent diameter of about 400 μm.

* * * * *